(12) United States Patent
Huang et al.

(10) Patent No.: US 9,418,763 B2
(45) Date of Patent: Aug. 16, 2016

(54) MEMORY ARRAY, MEMORY DEVICE, AND METHODS FOR READING AND OPERATING THE SAME

(71) Applicant: Semiconductor Manufacturing International (Shanghai) Corporation, Shanghai (CN)

(72) Inventors: Cheng-Tai Huang, Shanghai (CN); Jiaqi Yang, Shanghai (CN); Chen-Yi Huang, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 14/809,724

(22) Filed: Jul. 27, 2015

(65) Prior Publication Data

US 2016/0035434 A1 Feb. 4, 2016

(30) Foreign Application Priority Data

Jul. 30, 2014 (CN) .......................... 2014 1 0370621

(51) Int. Cl.
G11C 29/00 (2006.01)
G11C 17/16 (2006.01)
G11C 17/18 (2006.01)
G11C 29/04 (2006.01)

(52) U.S. Cl.
CPC .............. *G11C 29/787* (2013.01); *G11C 17/16* (2013.01); *G11C 17/18* (2013.01); *G11C 29/04* (2013.01)

(58) Field of Classification Search
CPC ...... G11C 29/00; G11C 29/04; G11C 29/785; G11C 29/787; G11C 29/838; G11C 17/16; G11C 17/18

USPC ............. 365/96, 63, 72, 185.02, 185.09, 200, 365/201, 225.7
See application file for complete search history.

(56) References Cited

U.S. PATENT DOCUMENTS

| | | | | |
|---|---|---|---|---|
| 5,617,364 A * | 4/1997 | Hatakeyama | .......... | G11C 29/78 365/185.09 |
| 5,910,916 A * | 6/1999 | Akaogi | .................. | G11C 16/08 257/E21.688 |
| 6,246,617 B1 * | 6/2001 | Urakawa | .............. | G11C 29/812 365/200 |
| 6,392,938 B1 * | 5/2002 | Choi | .................... | G11C 29/785 365/200 |
| 6,538,935 B1 * | 3/2003 | Suzuki | ................... | G11C 29/50 365/200 |
| 6,735,727 B1 * | 5/2004 | Lee | ........................ | G11C 16/08 365/200 |
| 6,788,596 B2 * | 9/2004 | Kim | ..................... | G11C 29/785 365/200 |
| 6,876,576 B2 * | 4/2005 | Hidaka | .................. | G11C 11/16 365/158 |
| 7,477,066 B2 * | 1/2009 | Kuo | .................... | G01R 1/07371 324/754.03 |
| 2016/0035439 A1* | 2/2016 | Huang | ................... | G11C 17/16 365/96 |

\* cited by examiner

*Primary Examiner* — Tan T. Nguyen
(74) *Attorney, Agent, or Firm* — Anova Law Group, PLLC

(57) ABSTRACT

The present invention provides a memory. The memory includes a plurality of memory cells arranged as an array with a plurality of rows and a plurality of column. A memory cell is connected to at least one redundant memory cell in a same row for storing same data as the memory cell; and a column of memory cells correspond to one redundant column of redundant memory cells wherein each redundant memory cell in the redundant column stores same data as the memory cell in a same row.

20 Claims, 10 Drawing Sheets

//  MEMORY ARRAY, MEMORY DEVICE, AND METHODS FOR READING AND OPERATING THE SAME

CROSS-REFERENCES TO RELATED APPLICATIONS

This application claims the priority of Chinese Patent Application No. 201410370621.9, filed on Jul. 30, 2014, the entire contents of which is incorporated herein by reference.

FIELD OF THE DISCLOSURE

The present disclosure relates to the field of semiconductor technology, more particularly, relates to a memory array and memory device, and methods for reading and operating the same.

BACKGROUND

The development of efuse technology is based on the characteristics of polysilicon fuse. The initial resistance of an efuse is considerably small, but when a high current flows through the efuse, the efuse may be melted and the resistance multiplies. Therefore, the value of the data programmed to an efuse memory cell may be reflected by whether the efuse is melted.

As shown in FIG. 1, an existing efuse memory circuit often includes m wordlines, n column-select transistors, n bitlines, n sense amplifiers (SAs), and an efuse memory array, where m and n are positive integers.

The m wordlines include: a first wordline WL1, a second wordline WL2, . . . , and an $m^{th}$ wordline WLm. The n column-select transistors include: a first column-select transistor M1, a second column-select transistor M2, a third column-select transistor M3, . . . , and an $n^{th}$ column-select transistor Mn. Each source of a column-select transistor is connected to the power supply voltage VDD.

The n bitlines include: a first bitline BL1, a second bitline BL2, a third bitline BL3, . . . , and an $n^{th}$ bitline BLn. Each one of the n bitlines is connected to the drain of the corresponding column-select transistor in the n column-select transistors.

The n sense amplifiers include: a first sense amplifier SA1, a second sense amplifier SA2, a third sense amplifier SA3, . . . , and an $n^{th}$ sense amplifier SAn. Each sense amplifier is connected to the corresponding bitline in the n bitlines.

That is, an efuse memory array may include an array of m (row)-by-n (column) memory cells. Each one of the m wordlines corresponds to one of the m rows of memory cells: each one of the n bitlines corresponds to one of the n columns of memory cells; and each memory cell corresponds to one wordline and one bitline.

Each memory cell includes a row-select transistor and an efuse. The gate of the row-select transistor is connected to the wordline corresponding to the memory cell, and the drain of the row-select transistor is connected to the first terminal of the efuse. The source of the row-select transistor is grounded (GND), and the second terminal of the efuse is connected to the bitline corresponding to the memory cell. For example, the memory cell 10 at (row 1, column 1) corresponds to the first wordline WL1 and the first bitline BL1. Memory cell 10 includes a row-select transistor M0 and an efuse F0. Of the row-select transistor M0, the gate is connected to the first wordline WL1, the drain is connected to the first terminal of the efuse F0, and the source is grounded. The second terminal of the efuse F0 is connected to the first bitline BL1.

The ON/OFF state of the a column-select transistor is controlled by applying a gate voltage on the column-select transistor, and the ON/OFF state of row-select transistors in a same row may be controlled by applying a voltage on the corresponding wordline. When the row-select transistor of a memory cell and the column-select transistor corresponding to the memory cell are both on, the efuse of the memory cell will be melted. The operation of melting an efuse is referred as a "write" operation to the memory cell. Whether an efuse is melted may be detected by testing the resistance of the efuse. When the resistance is higher than a certain threshold value, the efuse is considered melted, otherwise the efuse is considered not melted (i.e., the write operation to the memory cell fails).

Because a memory cell may not be written again once the efuse of the memory cell is melted, a memory cell may only be written once. The data often needs to be written to the memory cell is "1". That is, the efuse of the memory cell needs to be melted when "1" is to be stored into the memory cell. When "0" is to be stored into a memory cell, the efuse of the memory cell does not need to be melted.

However, writing a memory cell may be susceptible to programming failure, often caused by failing to melt the efuse after a "write" operation to the memory cell. The programming failure may result in an error when storing data to the memory cell. The programming error may further lead to reading error and, consequentially, low manufacturing yield of the corresponding memory device.

Build-in self repair (BISR) technique has been widely used to repair memory arrays. Often, a reconfigurable BISR scheme, e.g., a redundant circuit, to provide redundancy such that when programming failures and/or reading errors occur, the memory array may still operate with desired accuracy. In existing efuse technology, when a writing failure occurs in a memory cell of a row/column, the memory cells of the entire row/column may often need to be replaced. Certain redundancy techniques require a large area on the memory array or corresponding chip for redundancy circuits. Manufacturing yield of the memory array is undesirably low.

BRIEF SUMMARY OF THE DISCLOSURE

The disclosed method and system are directed to solve, for example, the problem of low manufacturing yield that currently exists in memory device manufacturing.

One aspect of the present disclosure provides a memory. The memory includes a plurality of memory cells arranged as an array with a plurality of rows and a plurality of column. A memory cell is connected to at least one redundant memory cell in a same row for storing same data as the memory cell; and a column of memory cells correspond to one redundant column of redundant memory cells wherein each redundant memory cell in the redundant column stores same data as the memory cell in a same row.

Another aspect of the present disclosure further provides a method for programming a memory. The memory contains a plurality of memory cells arranged as an array with a plurality of rows and a plurality of columns, a plurality of second MOS transistors, a plurality of sense amplifiers, and a plurality of third MOS transistors. A memory cell is connected to at least one redundant memory cell in a same row for storing same data as the memory cell, a column of memory cells correspond to one redundant column of redundant memory cells wherein each redundant memory cell in the redundant column stores same data as the memory cell in a same row. A first terminal of a second MOS transistor is connected to an input terminal of a sense amplifier and first terminals of memory cells of a column, and a first terminal of a third MOS transistor is connected to second terminals of memory cells of column (2$k$−1) and second terminals of memory cells of column 2$k$, wherein k is a positive integer. The method includes forming a path connecting the memory cell to be programmed, the second MOS transistor connected to the memory cell, and the third MOS transistor connected to the memory cell to program data to the memory cell.

Another aspect of the present disclosure further provides a method for operating a memory when programming of a first column fails. The method contains the first column, a second column with a higher column number, and a third MOS transistor connected to the first column and the second column. The second column is selected as a redundant column for the first column and memory cells in the redundant column are selected as redundant memory cells for memory cells in the first column, wherein each memory cell in the first column corresponds to a redundant memory cell in a same row in the redundant column; and programming data for the first column is programmed to the redundant column.

Other aspects of the present disclosure may be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Hereinafter, embodiments consistent with the disclosure will be described with reference to drawings. Wherever possible, the same reference numbers will be used throughout the drawings to refer to the same or like parts. It is apparent that the described embodiments are some but not all of the embodiments of the present invention. Based on the disclosed embodiment, persons of ordinary skill in the art may derive other embodiments consistent with the present disclosure, all of which are within the scope of the present invention.

Figure 1:
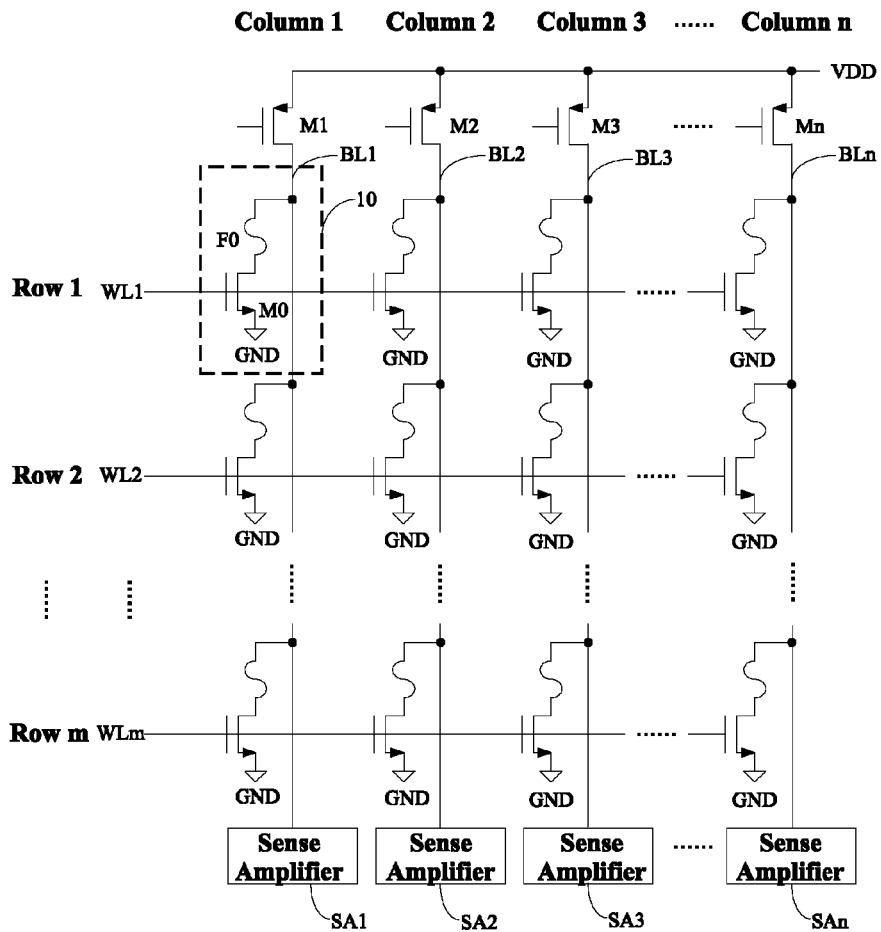
FIG. 1 illustrates structure of an existing memory device.
Figure 2:
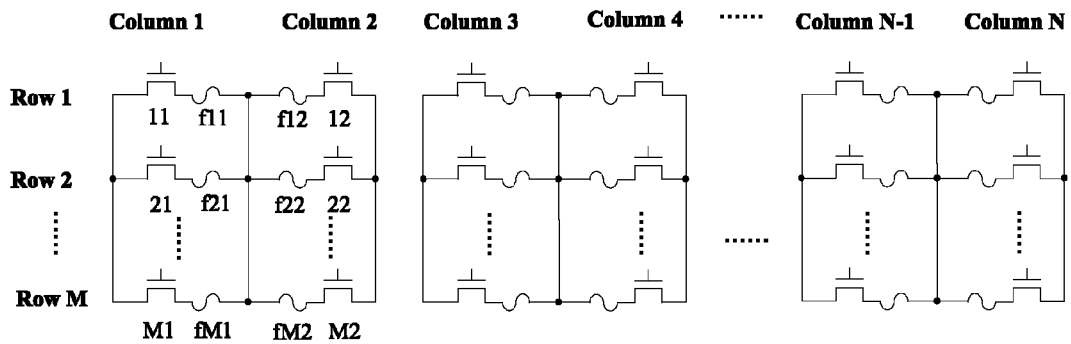
FIG. 2 illustrates structure of an exemplary memory array consistent with the disclosed embodiments.

As shown in FIG. 2, the present disclosure provides a memory array. The memory array includes memory cells arranged as an M (row)-by-N (column) array, where M≥1, N>1, and N is an even number. Each memory cell may include a first MOS transistor and an efuse. In a memory cell, the first terminal of the first MOS transistor may be connected to the first terminal of the efuse. Either the second terminal of the first MOS transistor or the second terminal of the efuse may be the first terminal of the memory cell, and the other may be the second terminal of the memory cell. The first terminals of the memory cells in a memory column or column may be connected together, and the second terminals of the memory cells in a column may be connected together. For example, the second terminals of the memory cells of column n may be connected to the second terminals of the memory cells of column (n−1), where N≥n>1 and n is an even integer.

For illustrative purposes, in the embodiments exemplified in the disclosure, the second terminal of a first MOS transistor is the first terminal of the corresponding memory cell, and the second terminal of an efuse is the second terminal of the corresponding memory cell.

In one embodiment, the first terminal of the first MOS transistor may be the drain of the first MOS transistor, and the second terminal may be the source of the first MOS transistor. Alternatively, the first terminal of the first MOS transistor may be the source of the first MOS transistor, and the second terminal may be the drain of the first MOS transistor.

Embodiments are exemplified using the memory cells in columns 1 to 4. In the memory cell at (row 1, column 1), the first terminal of first MOS transistor 11 may be connected to the first terminal of efuse f11. In the memory cell at (row 1, column 2), the first terminal of first MOS transistor 12 may be connected to the first terminal of efuse f12. In the memory cell at (row 2, column 1), the first terminal of first MOS transistor 21 may be connected to the first terminal of efuse f21. In the memory cell at (row 2, column 2), the first terminal of first MOS transistor 22 may be connected to the first terminal of efuse f22, and so on. Further, in the memory cell at (row M, column 1), the first terminal of first MOS transistor M1 may be connected to the first terminal of efuse fM1. In the memory cell at (row M, column 2), the first terminal of first MOS transistor M2 may be connected to the first terminal of efuse fM2.

Of column 1, the second terminals of the first first MOS transistor 11, the second first MOS transistor 21, . . . , and the M$^{th}$ first MOS transistor M1 may be connected together. Of column 2, the second terminals of the first first MOS transistor 12, the second first MOS transistor 22, . . . and the M$^{th}$ first MOS transistor M2 may be connected together.

Of column 1, the second terminals of the first efuse f11, the second efuse f21, . . . and the M$^{th}$ efuse fM1 may be connected together. Of column 2, the second terminals of the first efuse f12, the second efuse f22, . . . , and the M$^{th}$ efuse fM2 may be connected together.

The second terminals of the first efuse f1, the second efuse f21, . . . and the Mm efuse fM1 of column 1 may be connected to the second terminals of the first efuse f12, the second efuse 122, . . . and the M$^{th}$ efuse fM2 of column 2.

Figure 3:
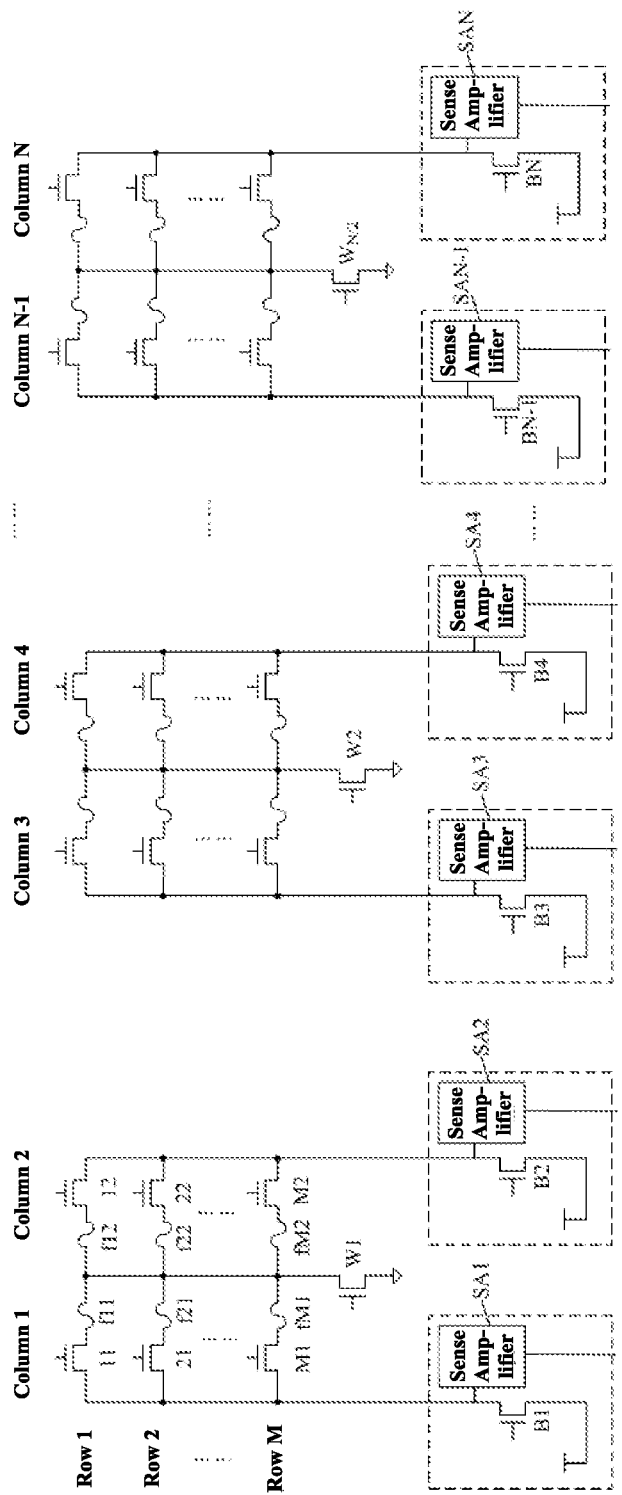
FIG. 3 illustrates structure of an exemplary memory device consistent with the disclosed embodiments.

As shown in FIG. 3, the present disclosure provides a memory device. The memory device includes the disclosed memory array, N second MOS transistors, N sense amplifiers, and N/2 third MOS transistors. The first terminal of the $j^{th}$ second MOS transistor may be connected to the input terminal of the $j^{th}$ sense amplifier and the first terminals of the memory cells of column j, where N≥j≥1. The first terminal of the $k^{th}$ third MOS transistor may be connected to the second terminals of the memory cells of column (2k−1) and the second terminals of the memory cells of column 2k, where N/2≥k≥1.

Specifically, the N second MOS transistors may include a first second MOS transistor B1, a second second MOS transistor B2, a third second MOS transistor B3, a fourth second MOS transistor B4, . . . , an (N−1)$^{th}$ second MOS transistor BN−1, and an N$^{th}$ second MOS transistor BN.

The N sense amplifiers may include a first sense amplifier SA1, a second sense amplifier SA2, a third sense amplifier SA3, a fourth sense amplifier SA4, . . . , an (N−1)$^{th}$ sense amplifier SA(N−1), and an N$^{th}$ sense amplifier SAN.

The N/2 third MOS transistors may include a first third MOS transistor W1, a second third MOS transistor W2, . . . , and an N/2$^{th}$ third MOS transistor $W_{N/2}$.

In one embodiment, the first terminal of the second MOS transistor may be the drain of the second MOS transistor, and the second terminal may be the source of the second MOS transistor. Alternatively, the first terminal of the second MOS transistor may be the source of the second MOS transistor, and the second terminal may be the drain of the second MOS transistor. The first terminal of the third MOS transistor may be the drain of the third MOS transistor, and the second terminal may be the source of the third MOS transistor. Alternatively, the first terminal of the third MOS transistor may be the source of the third MOS transistor, and the second terminal may be the drain of the third MOS transistor.

The structure of the memory device described above may be further illustrated using the memory cells of columns 1 and 2.

The first terminal of the first second MOS transistor B1 may be connected to the input terminal of SA1, the second terminal of the first first MOS transistor 11, the second terminal of the second first MOS transistor 21, . . . , and the second terminal of the M$^{th}$ first MOS transistor M1 of column 1.

The first terminal of the second second MOS transistor B2 may be connected to the input terminal of SA2, the second terminal of the first first MOS transistor 12, the second terminal of the second first MOS transistor 22, . . . , and the second terminal of the M$^{th}$ first MOS transistor M2 of column 2.

The first terminal of the first third MOS transistor W1 may be connected to the second terminal of the first efuse f11, the second terminal of the second efuse f21, . . . , and the second terminal of the M$^{th}$ efuse fM1 of column 1. The first terminal of the first third MOS transistor W1 may also be connected to the second terminal of the first efuse f12, the second terminal of the second efuse 122, . . . , and the second terminal of the M$^{th}$ efuse fM2 of column 2.

The present disclosure further provides a method for programming the disclosed memory device. The programming method includes forming a path connecting a memory cell to be programmed, the second MOS transistor connected to the memory cell, and the third MOS transistor connected to the memory cell to program data to the memory cell.

In one embodiment, the second MOS transistor connected to the memory cell may represent the second MOS transistor connected directly to the first MOS transistor of the memory cell, and the third MOS transistor connected to the memory cell may represent the third MOS transistor connected directly to the efuse of the memory cell. Further, the sense amplifier connected to the memory cell may represent the sense amplifier connected directly to the first MOS transistor of the memory cell.

Figure 4:
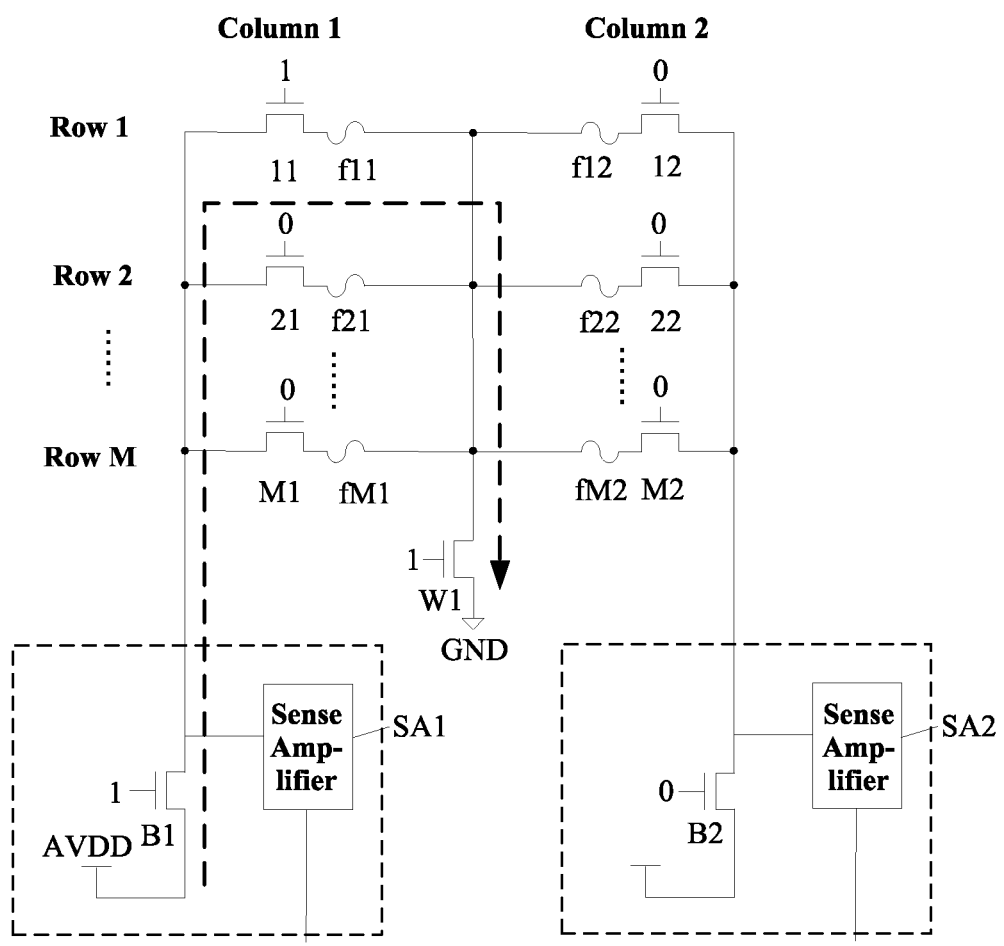
FIG. 4 illustrates an exemplary programming process for the memory device consistent with the disclosed embodiments.

As shown in FIG. 4, assuming the memory cell at (row 1, column 1) is the memory cell to be programmed. The second MOS transistor connected to the memory cell to be programmed may be the second MOS transistor B1 connected to the memory cell at (row 1, column 1). The third MOS transistor connected to the memory cell to be programmed may be the third MOS transistor W1 connected to the memory cell at (row 1, column 1).

The path connecting the memory cell to be programmed, the second MOS transistor connected to the memory cell, and the third MOS transistor connected to the memory cell may represent the electric path connecting the first MOS transistor of the memory cell to be programmed, the efuse of the memory cell to be programmed, the second MOS transistor connected to the memory cell to be programmed, and the third MOS transistor connected to the memory cell to be programmed to allow electric current to flow through.

Specifically, to form the path, the method further include turning on the first MOS transistor of the memory cell to be programmed, turning on the second MOS transistor connected to the memory cell, and turning on the third MOS transistor connected to the memory cell. To turn on the first MOS transistor 11, the second MOS transistor B1, and the third MOS transistor W1, a high voltage, such as the power supply voltage, may be applied on the gate of each of the MOS transistors. In FIG. 4, "1" represents a high voltage, and "0" represents a low voltage.

To program data to the memory cell to be programmed, a first voltage may be applied on the second terminal of the second MOS transistor connected to the memory cell to be programmed, and a second voltage may be applied on the second terminal of the third MOS transistor connected to the memory cell to be programmed. The first voltage is not equal to the second voltage.

Figure 5:
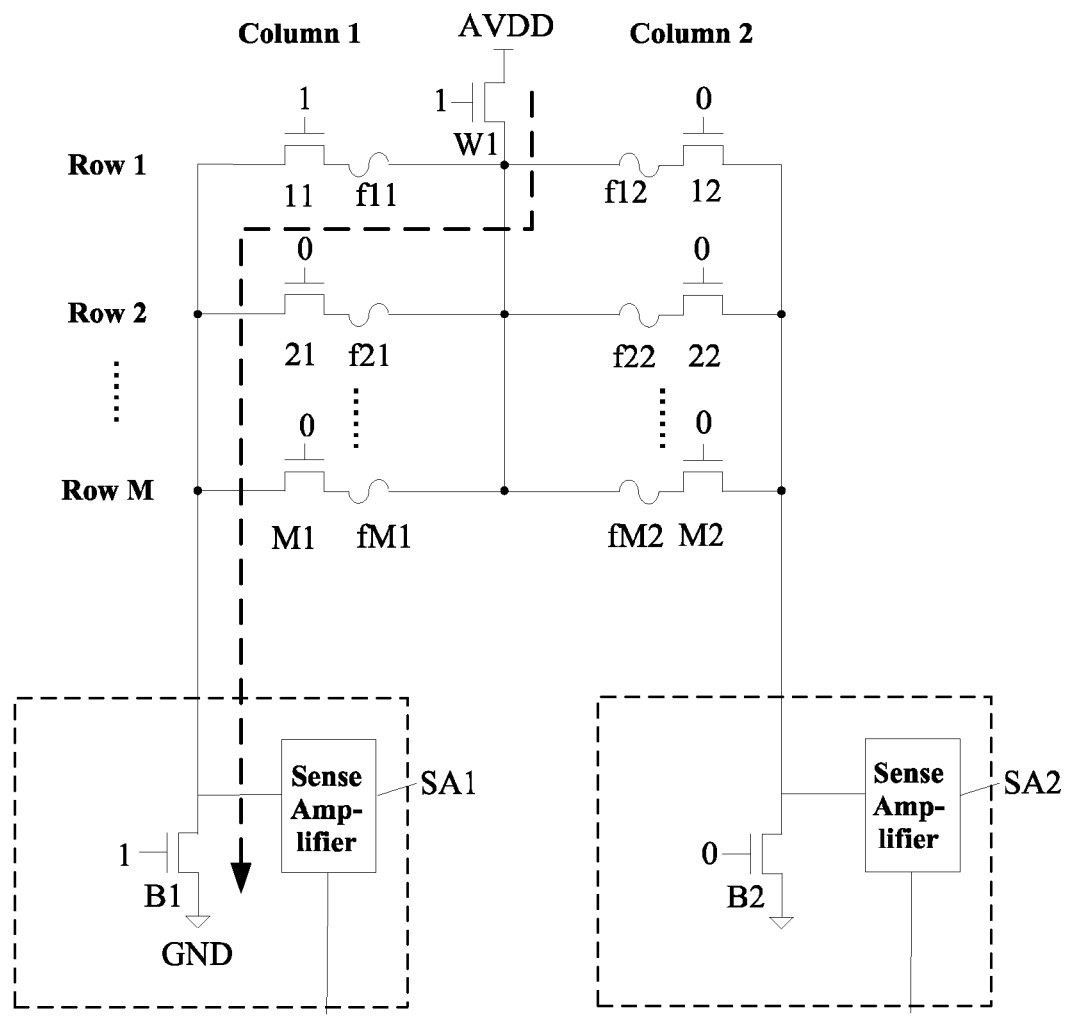
FIG. 5 illustrates another exemplary programming process for the memory device consistent with the disclosed embodiments.

As shown in FIG. 4, the voltage applied on the second terminal of the second MOS transistor may be different from the voltage applied on the second terminal of the third MOS transistor to melt the efuse of the memory cell to be programmed. Thus, the difference between the first voltage and the second voltage may be determined by the electric current required to melt the efuse. Specifically, a programming voltage AVDD may be applied on the second terminal of the second MOS transistor B1, and the ground voltage GND may be applied on the second terminal of the third MOS transistor W1. Because first MOS transistor 11, second MOS transistor B1, and third MOS transistor W1 are turned on, electric current may flow from the second terminal of second MOS transistor B1, through efuse f11, and to the second terminal of third MOS transistor W1. By controlling the intensity and the on-time of the current, efuse f11 may be melted such that the memory cell at (row 1, column 1) can be programmed. Similarly, as shown in FIG. 5, by applying the ground voltage GND on the second terminal of second MOS transistor B1, and applying the programming voltage AVDD on the second terminal of third MOS transistor W1, electric current may flow from the second terminal of third MOS transistor W1, through efuse f1, and to the second terminal of second MOS transistor B1 to program the memory cell at (row 1, column 1).

When programming a memory cell, the first MOS transistors of the memory cell not to be programmed may be turned off. The memory cell not to be programmed may refer to all memory cells other than the memory cell to be programmed or being programmed. For example, when the memory cell to be programmed is the memory cell at (row 1, column 1), all the memory cells other than the memory cell at (row 1, column 1) are not to be programmed. By applying a low voltage "0", e.g., the ground voltage GND, on the gates of the first MOS transistors of the memory cells not to be programmed, the first MOS transistors of the memory cells not to be programmed may be turned off.

In some embodiments, to confine the direction of the electric current, the sense amplifier connected to the memory cell to be programmed may be disabled; the second MOS transistors not connected to the memory cell to be programmed may be turned off; the third MOS transistors not connected to the memory cell to be programmed may be turned off; and/or the sense amplifiers not connected to the memory cell to be programmed may be turned off. A sense amplifier may be disabled by transmitting a disable signal to the sense amplifier.

The present disclosure further provides a non-redundant reading method for the memory device. The non-redundant reading method includes forming a path connecting a memory cell to be read, the sense amplifier connected to the memory cell, and the third MOS transistor connected to the memory cell to read data from the memory cell.

The path connecting the memory cell to be read, the sense amplifier connected to the memory cell, and the third MOS transistor connected to the memory cell may be the electric path connecting the first MOS transistor of the memory cell to be read, the efuse of the memory cell, the third MOS transistor connected to the memory cell, and the sense amplifier connected to the memory cell.

Specifically, to form the path, the non-redundant reading method may include turning on the first MOS transistor of the memory cell to be read and the third MOS transistor connected to the memory cell to be read, and enabling the sense amplifier connected to the memory cell to be read.

A first MOS transistor and a third MOS transistor may be turned on by applying a high voltage "1" on the gates of the first MOS transistor and the third MOS transistor. A second MOS transistor may be turned off by applying a low voltage "0" on the gate of the second MOS transistor. A sense amplifier may be enabled by sending an enable signal to the sense amplifier.

When reading data from the memory cell to be read, power supply voltage or ground voltage may be applied on the second terminal of the third MOS transistor connected to the memory cell to be read.

Figure 6:
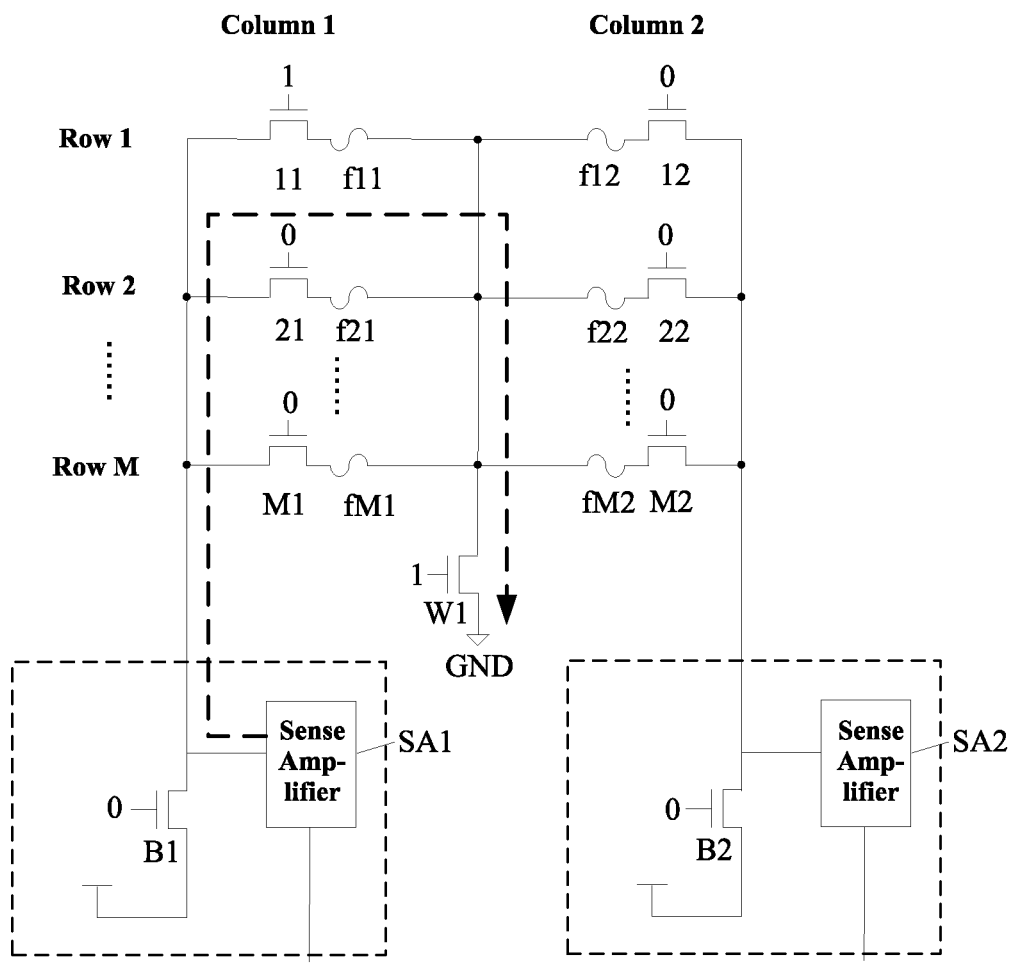
FIG. 6 illustrates an exemplary non-redundant reading process for the memory device consistent with the disclosed embodiments.
Figure 7:
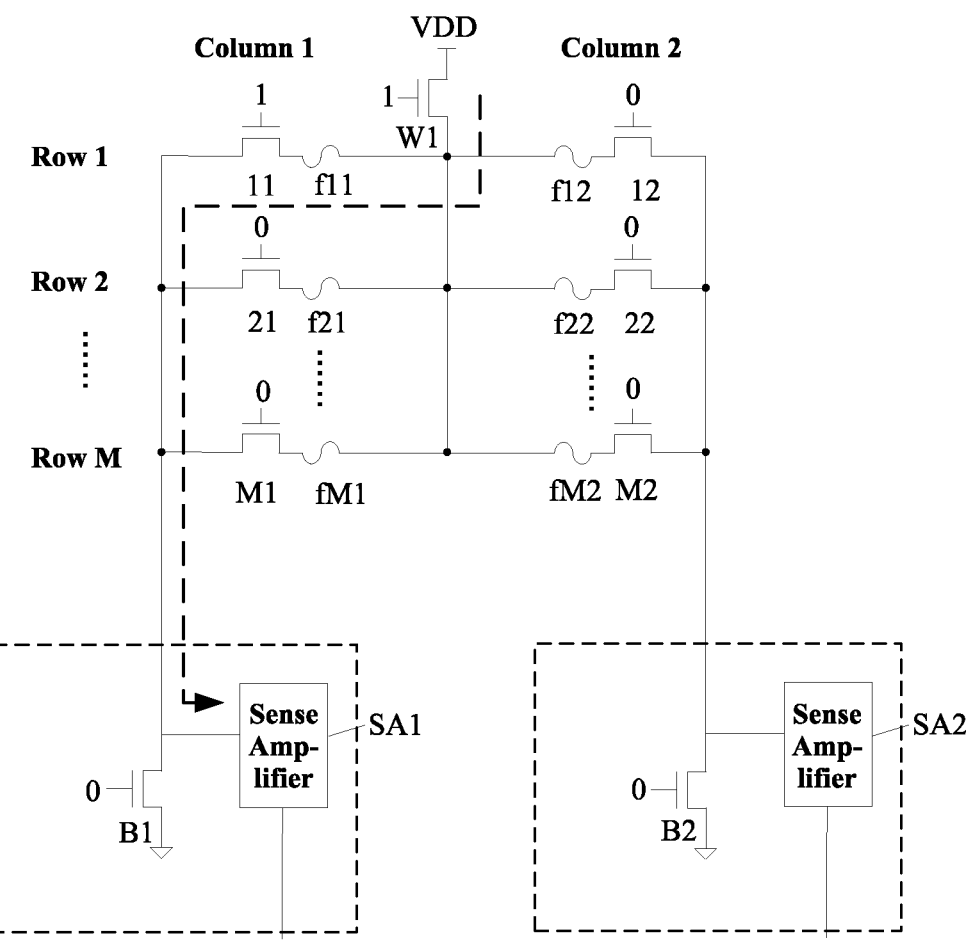
FIG. 7 illustrates another exemplary non-redundant reading process for the memory device consistent with the disclosed embodiments.

As shown in FIG. 6, assuming the memory cell at (row 1, column 1) is to be read, the third MOS transistor connected to the memory cell to be read may be the third MOS transistor W1 connected to the memory cell at (row 1, column 1). The sense amplifier connected to the memory cell to be read may be the sense amplifier SA1 connected to the memory cell at (row 1, column 1). The second MOS transistor connected to the memory cell to be read may be the second MOS transistor B1 connected to the memory cell at (row 1, column 1). When ground voltage GND is applied on the second terminal of the third MOS transistor W1, the enabled SA1 may detect the electrical current and output a voltage that represents the data stored in the memory cell being read. Similarly, as illustrated in FIG. 7, when the power supply voltage VDD is applied on the second terminal of the third MOS transistor W1, the enabled SA1 may detect the electric current, and output a voltage that represents the data stored in the memory cell being read.

When reading data from the memory cell, the first MOS transistors in the memory cells not to be read may be turned off. The memory cells not to be read may be all memory cells other than the memory cell to be read or being read.

In some embodiments, to read data from the memory cell to be read, the second MOS transistor connected to the memory cell to be read may be turned off; the sense amplifiers not connected to the memory cell to be read may be disabled; the second MOS transistors not connected to the memory cell to be read may be turned off; and/or the third MOS transistors not connected to the memory cell to be read may be turned off.

The disclosed programming method may be used to program "1" to a memory cell. However, during the programming process, the efuse might not be melted if the current intensity flowing through the memory cell is not high enough, and/or the on-time of the current is not long enough. Thus, if the efuse is not melted after the programming process, the programming process fails or a programming failure occurs. To detect whether a programming has occurred, non-redundant memory reading may be used after the programming process. When the non-redundant reading method is used to read data from a memory cell of which the efuse is not melted, the reading of the sense amplifier gives a "0". When reading from a memory cell of which the efuse is melted, the reading of the sense amplifier gives a "1". Thus, when the programming data of a memory cell differs from the data read from the same memory cell, the programming process fails. In the disclosure, the programming data for a memory cell or column may refer to the data to be programmed, being programmed, or programmed into the memory cell or column. The reading data of a memory cell or column may refer to the data to be read, being read, or read from the memory cell or column.

To solve the problems caused by programming failures, the present disclosure provides a method for operating the disclosed memory device. The method includes selecting column (p+1) as a redundant column p for column p, and programming the programming data for column p into the redundant column p, where $N-1 \geq p \geq 1$. Column p and redundant column p may share a same third MOS transistor.

Column p may be any column in the memory array/device. The redundant column p may be one column other than column p with a higher column number. A redundant column p may be configured to provide accurate reading results even after programming failures occur when programming column p. Specifically, in various embodiments, each memory cell in column p may correspond to one memory cell in the same row in a redundant column p. Each memory cell in redundant column p may be referred as the redundant memory cell for the corresponding memory cell in column p.

For a column p, one or more redundant columns can be selected to store redundant data (e.g., writing data for column p) corresponding to column p. Together, the one or more redundant columns can be referred as "the redundant columns for column p". In this case, arranged by the column number from low to high, each of the redundant columns for column p may be referred as a first redundant column p (i.e., the first column of the redundant columns for column p), a second redundant column p (i.e., the second column of the redundant columns for column p), and so on.

The method for operating the memory device may be implemented when the programming of column p fails. After data is programmed to the memory cells in column p, a programming failure can be tested. A path connecting the memory cells from row 1 to row M of column p, the sense amplifier connected to column p, and the third MOS transistor connected to column p may be formed to read data from column p. When the programming data for column p is different from the reading data of column p, the programming of column p fails. When the programming of column p is successful, programming data for column (p+1) may be programmed to column (p+1). The testing of programming failure may be performed after the whole column is programmed, or after each memory cell is programmed.

Assuming a memory device includes a 6 (row)-by-2 (column) memory array. The data to be programmed to column 1 may be "101010", and the data to be programmed to column 2 may be "111100". Using the disclosed programming method, "101010" may be programmed to column 1 first.

After the programming process is completed, the disclosed non-redundant reading method for the memory device may be used to read data stored in column 1. If the data is read as "001010", different from "101010", the programming data for column 1, the programming of column 1 fails. After the programming failure is detected, column 2 may then be selected as a redundant column 1, and the programming data "101010" for column 1 may be programmed to redundant column 1 using the disclosed programming method. That is, programming data "101010" may be programmed to the original column 2. Because the original column 2 is selected as a redundant column 1, the original column 3 may be column 2. Thus, the programming for the original column 2 may be programmed to the original column 3, and so forth.

After the programming process is completed, the disclosed non-redundant reading method may be used to read data stored in column 1. If the data is read as "101010", same as the "101010", the programmed data for column 1, the programming of column 1 is successful. After the programming of column 1 is tested to be successful, "111100", the programming data for column 2 may be programmed to column 2 using the disclosed programming method.

In accordance with the method for operating the memory device, the present disclosure further provides a redundant reading method for the memory device. The redundant reading method includes forming a path connecting the redundant memory cell to be read in a redundant column p, the memory cell to be read in column p corresponding to the redundant memory cell, the sense amplifier connected to the redundant column p, and the second MOS transistor connected to column p to read data, where N−1≥p≥1. Column p and the redundant column p may share the same third MOS transistor. The redundant column p may be selected when the programming of column p fails.

A redundant memory cell may be a memory cell in a redundant column. A redundant memory cell may correspond to a memory cell and is used to store the same data as the corresponding memory cell. A redundant memory cell and the corresponding memory cell may be in the same row of the memory array. Thus, the redundant memory cell to be read in redundant column p may be in the same row with the corresponding memory cell to be read in column p.

The path connecting the redundant memory cell to be read in redundant column p, the memory cell to be read in column p corresponding to redundant column p, the sense amplifier connected to redundant column p, and the second MOS transistor connected to column p may represent: the electric path connecting the first MOS transistor of the redundant memory cell to be read in redundant column p, the efuse of the redundant memory cell to be read, the first MOS transistor of the memory cell to be read in column p corresponding to redundant column p, the efuse of the memory cell to be read, the sense amplifier connected to the redundant column p, and the second MOS transistor connected to column p.

The redundant reading method may include turning on the first MOS transistor of the redundant memory cell to be read in redundant column p, turning on the first MOS transistor of the memory cell in column p corresponding to redundant column p, and turning on the second MOS transistor connected to the memory cell in column p. The redundant reading method also includes enabling the sense amplifier connected to the redundant memory cell in redundant column p.

The controlling of the ON/OFF state of a first MOS transistor, a second MOS transistor, and a third MOS transistor, and the enabling and disabling of a sense amplifier are aforementioned and thus omitted herein.

When reading data from the redundant memory cell, the power supply voltage VDD or ground voltage GND may be applied on the second terminal of the second MOS transistor connected to column p.

Figure 8:
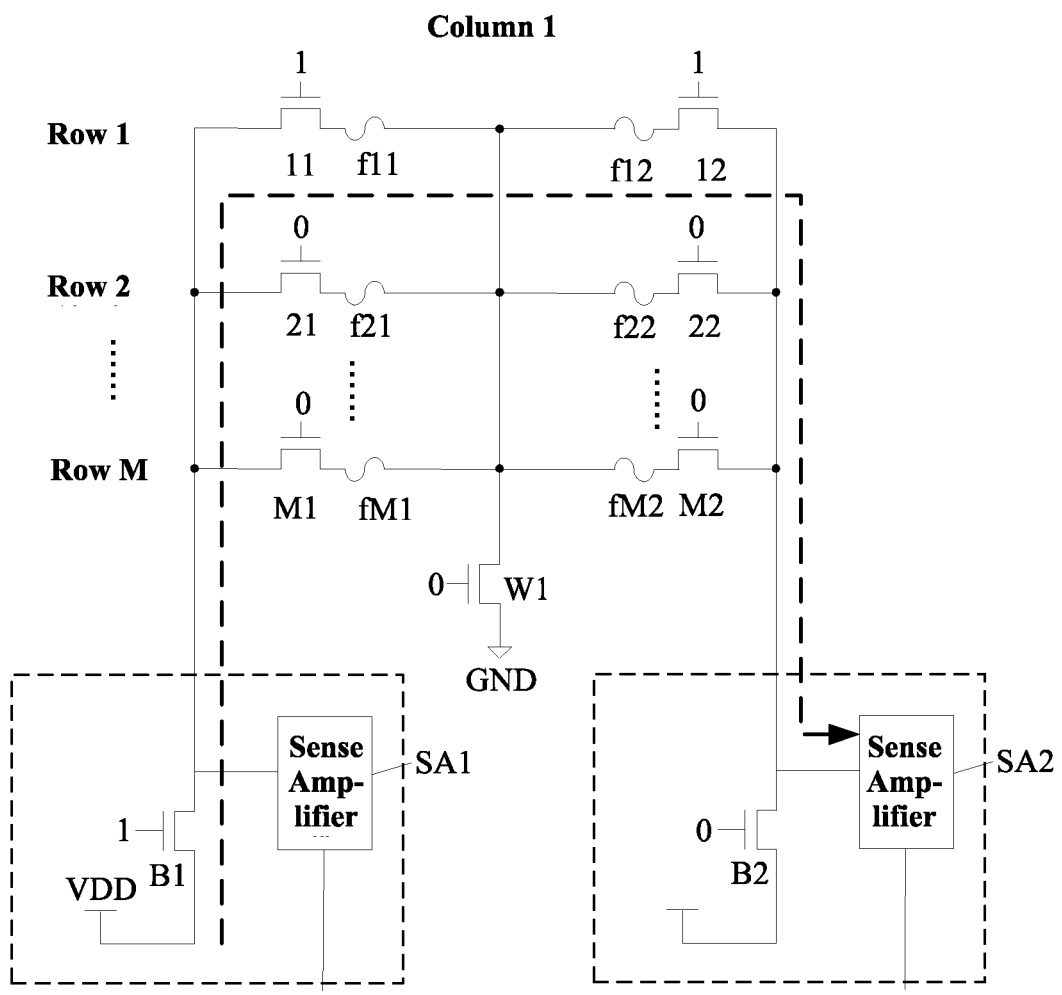
FIG. 8 illustrates an exemplary redundant reading process for the memory device consistent with the disclosed embodiments.

As illustrated in FIG. 8, if programming column 1 fails, column 2 may be selected as the redundant column corresponding to column 1, and data programmed to column 1 may be programmed to redundant column 1.

Assuming data may be read row by row, and the memory cell at (row 1, column 1) may be the memory cell to be read. Redundant memory cell corresponding to the memory cell at (row 1, column 1) may be the redundant memory cell to be read. A high voltage "1" may be applied on first MOS transistor 11 of the memory cell at (row 1, column 1) and first MOS transistor 12 of the redundant memory cell at row 1 of redundant column 1. A high voltage "1" may be applied on second MOS transistor B1 connected to the memory cell at (row 1, column 1). An enabling signal may be sent to SA2 connected to the redundant memory cell at row 1 of redundant column 1. A low voltage "0" may be applied on second MOS transistor B2 and third MOS transistor W1 connected to the redundant memory cell at row 1 of redundant column 1. Power supply voltage VDD may be applied on the second terminal of the second MOS transistor B1, allowing electric current (i.e., a test current) to flow through the second terminal of second MOS transistor B1, efuse f11 of the memory cell at (row 1, column 1), efuse f12 of the redundant memory cell at row 1 of redundant column 1, and to SA2. SA2 may then read data based on the received test current and the voltage of the second terminal of first MOS transistor 12. If either one of f11 or f12 is melted, the data read by SA2 may be "1". Thus, when programming data to column 1 and redundant memory cell 1, only one successful programming is required for correct data to be read out using the redundant reading method.

For example, assuming a memory device includes of a 6 (row)-by-2 (column) memory array. The data to be programmed to column 1 may be "101010", and the data to be programmed to column 2 may be "111100".

By using the disclosed programming method, "101010" may be programmed to column 1, and read out using the disclosed non-redundant reading method. If the data read from column 1 is "001010", different from "101010", the programming data for column 1, the programming of column 1 fails.

After the programming of column 1 fails, column 2 may be selected as a redundant column 1. The programming data for column 1, "101010", may be programmed to redundant column 1 using the disclosed programming method.

If the programming of redundant column 1 is successful, the disclosed redundant reading method may be used to read data from the memory cell at (row 1, column 1) and the corresponding redundant memory cell. Because the efuse of the memory cell at (row 1, column 1) is not melted and the efuse of the corresponding redundant memory cell is melted, the data detected by SA2 may be "1". Thus, by using the disclosed memory device and redundant reading method may greatly improve the manufacturing yield of the memory device.

Figure 9:
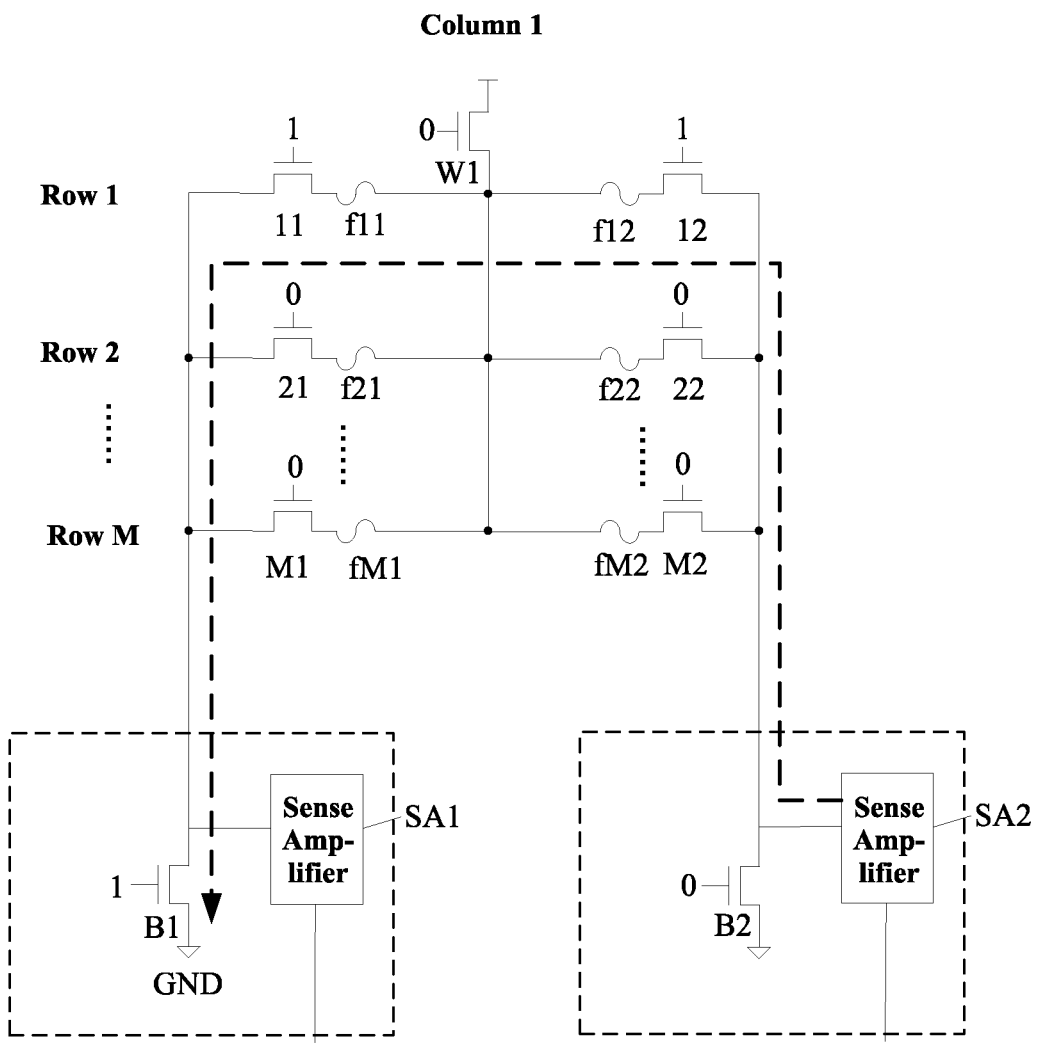
FIG. 9 illustrates another exemplary redundant reading process for the memory device consistent with the disclosed embodiments.

When the redundant reading method for the memory device is being implemented, ground voltage GND may be applied on the second terminal of the second MOS transistor connected to column p, as shown in FIG. 9.

When using the redundant reading method to read data, the first MOS transistors of the memory cells not to be read may be turned off. The memory cells not to be read may be all memory cells other than the memory cell to be read and the corresponding redundant memory cell to be read.

To use the redundant reading method to read data, the second MOS transistor and the third MOS transistor connected to column p can be turned off, the sense amplifier connected to redundant column p may be disabled; the sense amplifiers not connected to the column p or redundant column p may be disabled, the second MOS transistors not connected to column p or redundant column p may be turned off, and/or the third MOS transistors not connected to column p or redundant column p may be turned off.

In the embodiment described above, the sense amplifier connected to the redundant memory cell to be read is used to read data. In practice, the sense amplifier connected to the memory cell corresponding to the redundant memory cell may also be used to read data. Embodiments of the present disclosure further provide another redundant reading method for the memory device. The redundant reading method includes forming a path connecting the redundant memory cell to be read in redundant column p, the corresponding memory cell to be read in column p, the second MOS transistor connected to the redundant column p, and the sense amplifier connected to column p to read data, where N−1≥p≥1. Column p and redundant column p share a same third MOS transistor.

Figure 10:
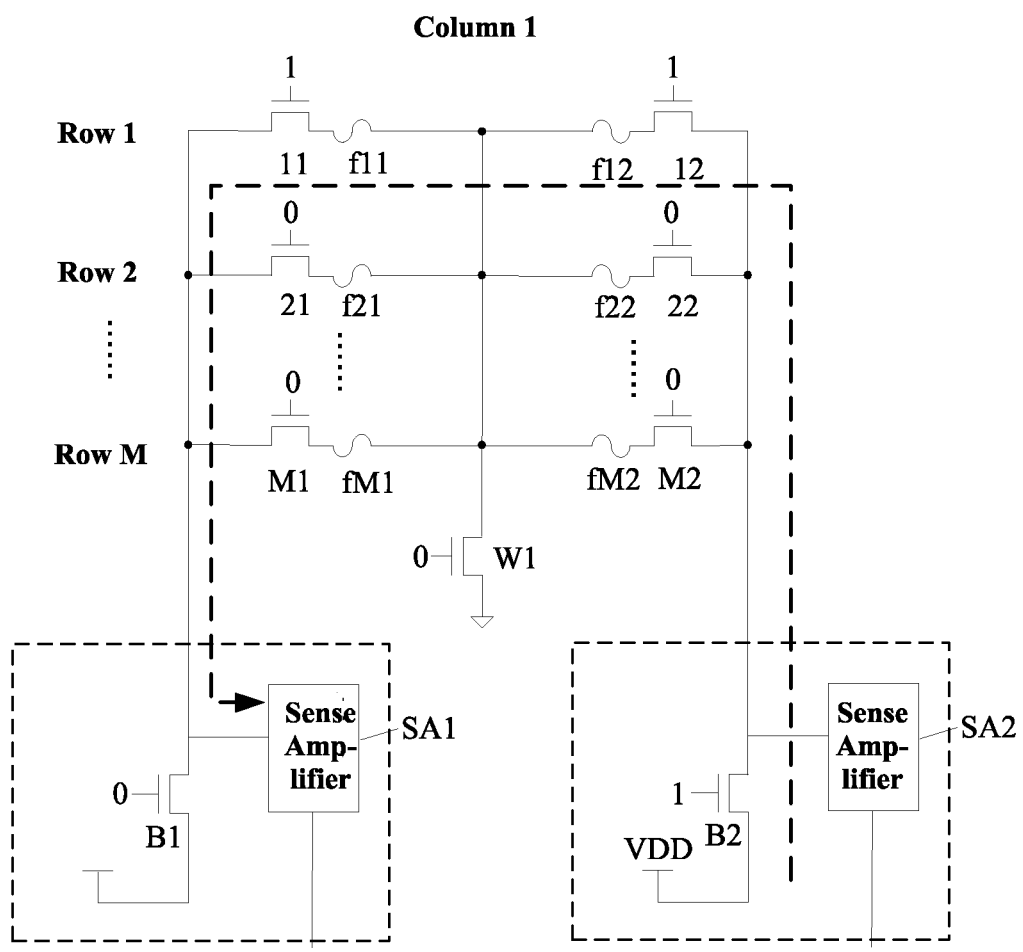
FIG. 10 illustrates another exemplary redundant reading process for the memory device consistent with the disclosed embodiments.
Figure 11:
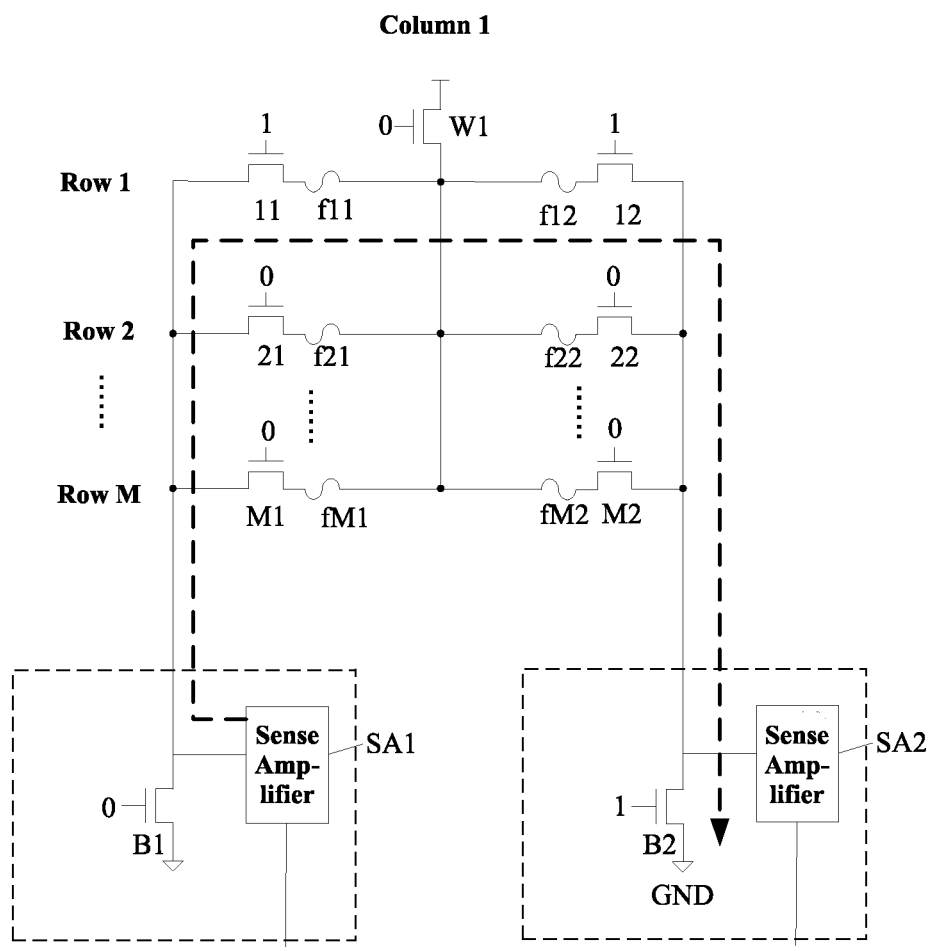
FIG. 11 illustrates another exemplary redundant reading process for the memory device consistent with the disclosed embodiments.

As illustrated in FIG. 10, assuming the memory cell at (row 1, column 1) is the memory cell to be read, and redundant memory cell at row 1 of redundant column 1 is the redundant memory cell to be read. The power supply voltage VDD may be applied on the second terminal of second MOS transistor B2 connected to redundant memory cell at row 1 of redundant column 1, the redundant memory cell to be read, the memory cell at (row 1, column 1) corresponding to the redundant memory cell, second MOS transistor B2 connected to the redundant memory cell, and sense amplifier SA1 connected to memory cell at (row 1, column 1), for SA1 to read data. It should be noted that, ground voltage GND may be applied on the second terminal of second MOS transistor B2 connected to the redundant memory cell, as shown in FIG. 11. The working principles and operation to read data using SA1 are similar to using SA2 as described in previous embodiments and are thus omitted herein.

Compared with existing technologies, the present disclosure provides a novel memory array and memory device. By using the disclosed methods for programming, operating, and reading, correct data may be read out even after the programming of the memory array or memory device fails. The manufacturing yield of the memory device can be greatly improved.

Other embodiments of the disclosure will be apparent to those skilled in the art from consideration of the specification and practice of the invention disclosed herein. It is intended that the specification and examples be considered as exemplary only, with a true scope and spirit of the invention being indicated by the claims

What is claimed is:

1. A memory, comprising a plurality of memory cells arranged as an array with a plurality of rows and a plurality of columns column, wherein:
    each memory cell includes a first MOS transistor and an efuse;
    in a memory cell, a first terminal of a first MOS transistor is connected to a first terminal of the efuse, one of a second terminal of the first MOS transistor and a second terminal of the efuse being a first terminal of the memory cell, and another of the second terminal of the first MOS transistor and the second terminal of the efuse being a second terminal of the memory cell;
    a memory cell is connected to at least one redundant memory cell in a same row for storing same data as the memory cell; and
    a column of memory cells correspond to one redundant column of redundant memory cells wherein each redundant memory cell in the redundant column stores same data as the memory cell in a same row, wherein the column of memory cells and the redundant column of redundant memory cells share a MOS transistor.

2. The memory according to claim 1, further including:
    a plurality of second MOS transistors, a plurality of sense amplifiers, and a plurality of third MOS transistors, wherein:
    a first terminal of a second MOS transistor is connected to an input terminal of a sense amplifier and first terminals of memory cells of a column; and
    a first terminal of a third MOS transistor is connected to second terminals of memory cells of column (2k−1) and second terminals of memory cells of column 2k, wherein k is a positive integer.

3. A memory, comprising a plurality of memory cells arranged as an array with a plurality of rows and a plurality of columns, wherein:
    each memory cell includes a first MOS transistor and an efuse;
    in a memory cell, a first terminal of a first MOS transistor is connected to a first terminal of the efuse, one of a second terminal of the first MOS transistor and a second terminal of the efuse being a first terminal of the memory cell, and another of the second terminal of the first MOS transistor and the second terminal of the efuse being a second terminal of the memory cell;
    a memory cell is connected to at least one redundant memory cell in a same row for storing same data as the memory cell;
    a column of memory cells correspond to one redundant column of redundant memory cells wherein each redundant memory cell in the redundant column stores same data as the memory cell in a same row, wherein the column of memory cells and the redundant column of redundant memory cells share a MOS transistor;
    first terminals of memory cells in a column are connected together, and second terminals of memory cells in the column are connected together; and
    second terminals of memory cells in a column are connected to second terminals of memory cells in a column with a lower column number.

4. The memory according to claim 3, wherein the first terminal of the first MOS transistor is a drain of the first MOS transistor and the second terminal of the first MOS transistor is a source of the first MOS transistor, or the first terminal of the first MOS transistor is the source of the first MOS transistor, and the second terminal of the first MOS transistor is the drain of the first MOS transistor.

5. A method for programming a memory containing a plurality of memory cells arranged as an array with a plurality of rows and a plurality of columns, a plurality of second MOS transistors, a plurality of sense amplifiers, and a plurality of third MOS transistors, wherein a memory cell is connected to at least one redundant memory cell in a same row for storing same data as the memory cell, a column of memory cells correspond to one redundant column of redundant memory cells wherein each redundant memory cell in the redundant column stores same data as the memory cell in a same row, a first terminal of a second MOS transistor is connected to an input terminal of a sense amplifier and first terminals of memory cells of a column, and a first terminal of a third MOS transistor is connected to second terminals of memory cells of column ($2k-1$) and second terminals of memory cells of column $2k$, wherein k is a positive integer, the method comprising:

forming a path connecting the memory cell to be programmed, the second MOS transistor connected to the memory cell, and the third MOS transistor connected to the memory cell to program data to the memory cell.

6. The method according to claim 5, wherein forming the path includes:

turning on the first MOS transistor of the memory cell to be programmed;

turning on the second MOS transistor connected to the memory cell to be programmed; and turning on the third MOS transistor connected to the memory cell to be programmed.

7. The method according to claim 5, further including:

applying a first voltage on a second terminal of the second MOS transistor connected to the memory cell to be programmed; and applying a second voltage on a second terminal of the third MOS transistor connected to the memory cell to be programmed, wherein the first voltage is not equal to the second voltage.

8. The method according to claim 5, further including one or more of:

disabling the sense amplifier connected to the memory cell to be programmed;

turning off first MOS transistors of memory cell not to be programmed;

turning off second MOS transistors not connected to the memory cell to be programmed;

turning off third MOS transistors not connected to the memory cell to be programmed; and disabling sense amplifiers not connected to the memory cell to be programmed.

9. The method according to claim 5, further including a non-redundant reading process containing a memory cell to be read, a sense amplifier connected to the memory cell, and a third MOS transistor connected to the memory cell, wherein the non-redundant reading process comprising:

forming a path connecting the memory cell to be read, the sense amplifier connected to the memory cell to be read, and the third MOS transistor connected to the memory cell to read data from the memory cell.

10. The method according to claim 9, wherein forming the path includes:

turning on a first MOS transistor of the memory cell to be read and the third MOS transistor connected to the memory cell to be read; and enabling the sense amplifier connected to the memory cell to be read.

11. The method according to claim 9, wherein the non-redundant reading process further includes one or more of:

turning off a second MOS transistor connected to the memory cell to be read;

turning off first MOS transistors of memory cells not to be read;

disabling sense amplifiers not connected to the memory cell to be read;

turning off second MOS transistors not connected to the memory cell to be read; and turning off third MOS transistors not connected to the memory cell to be read.

12. A method for operating a memory when programming of a first column fails, containing the first column, a second column with a higher column number, and a third MOS transistor commonly connected to the first column and the second column, wherein:

the second column is selected as a redundant column for the first column and memory cells in the redundant column are selected as redundant memory cells for memory cells in the first column, wherein each memory cell in the first column corresponds to a redundant memory cell in a same row in the redundant column; and programming data for the first column is programmed to the redundant column.

13. The method according to claim 12, wherein:

column (p+1) is selected as a redundant column p for column p, where p is a positive integer.

14. The method according to claim 12, wherein:

if programming the programming data for column p into column p is successful, programming data for column (p+1) is programmed into column (p+1), where p is a positive integer.

15. The method according to claim 12, further including a redundant reading process containing a redundant memory cell to be read in a redundant column p, a memory cell to be read in column p corresponding to the redundant column p, a sense amplifier connected to the redundant column p, a second MOS transistor connected to column p, and a third MOS transistor connected to column p and the redundant column p, wherein the redundant reading process includes:

forming a path connecting the redundant memory cell to be read in the redundant column p, the memory cell to be read in column p corresponding to the redundant column p, the sense amplifier connected to the redundant column p, and the second MOS transistor connected to column p, wherein p is a positive integer.

16. The method according to claim 15, wherein forming the path further including:

turning on a first MOS transistor of the redundant memory cell to be read in the redundant column p, a first MOS transistor of the memory cell to be read in column p corresponding to redundant column p, and a second MOS transistor connected to the memory cell to be read in column p; and enabling a sense amplifier connected to the redundant column p.

17. The method according to claim 15, wherein the redundant reading process further includes one or more of:

turning off the second MOS transistor and the third MOS transistor connected to the redundant column p;

disabling the sense amplifier connected to column p;

turning off first MOS transistors of the memory cells not to be read;

disabling the sense amplifiers not connected to column p or the redundant column p;

turning off second MOS transistors not connected to column p or redundant column p; and turning off third MOS transistors not connected to column p or the redundant column p.

18. The method according to claim 15, wherein the redundant reading process further includes:

forming a path connecting the redundant memory cell to be read in the redundant column p, the memory cell to be read in column p corresponding to redundant column p, a second MOS transistor connected to redundant column p, and a sense amplifier connected to column p to read data, wherein:

the redundant column p and column p share a third MOS transistor and p is a positive integer.

19. The method according to claim 18, wherein forming the path includes:

turning on a first MOS transistor of the redundant memory cell to be read in the redundant column p, turning on a first MOS transistor of the memory cell to be read in column p corresponding to the redundant column p, and turning on the second MOS transistors connected to redundant column p; and enabling the sense amplifier connected to column p.

20. The method according to claim 18, wherein the redundant reading process further includes one or more of:

turning off the second MOS transistor and the third MOS transistor connected to column p;

disabling the sense amplifier connected to the redundant column p;

turning off first MOS transistors of memory cells not to be read;

disabling sense amplifiers not connected to column p or the redundant column p;

turning off second MOS transistors not connected to column p or the redundant column p; and turning off third MOS transistors not connected to column p or the redundant column p.

* * * * *